(12) United States Patent
Shen

(10) Patent No.: US 7,000,169 B2
(45) Date of Patent: Feb. 14, 2006

(54) TURBO DECODING

(75) Inventor: Qiang Shen, San Diego, CA (US)

(73) Assignee: LSI Logic Corporation, Milpitas, CA (US)

(*) Notice: Subject to any disclaimer, the term of this patent is extended or adjusted under 35 U.S.C. 154(b) by 28 days.

(21) Appl. No.: 10/691,078

(22) Filed: Oct. 21, 2003

(65) Prior Publication Data
US 2004/0081261 A1 Apr. 29, 2004

Related U.S. Application Data

(62) Division of application No. 09/668,059, filed on Sep. 20, 2000, now abandoned.

(51) Int. Cl.
H03M 13/00 (2006.01)
(52) U.S. Cl. .................. 714/755; 714/752; 714/746
(58) Field of Classification Search ................ 714/755, 714/794, 762, 752, 746; 375/259, 316; 365/236
See application file for complete search history.

(56) References Cited

U.S. PATENT DOCUMENTS

| 4,394,753 | A | * | 7/1983 | Penzel ................. 365/236 |
| 5,483,541 | A | | 1/1996 | Linsky |
| 6,014,411 | A | * | 1/2000 | Wang .................. 375/259 |
| 6,359,938 | B1 | * | 3/2002 | Keevill et al. .......... 375/316 |
| 6,442,728 | B1 | | 8/2002 | Cui et al. |
| 6,526,539 | B1 | * | 2/2003 | Yano et al. ............. 714/794 |
| 6,631,491 | B1 | * | 10/2003 | Shibutani et al. ........ 714/762 |

OTHER PUBLICATIONS

Heegard, Chris and Wicker, Stephen B., "Turbo Coding", Chapter 3, pp. 39-40, pp. 44-46, Kluwer Academic Publishers, 1999.

Fung, Dr. Mike, "The Supertek S-1 Mini-Supercomputer", Compcon Spring '88, Thirty-Third IEEE Computer Society International Conference, Digest of Papers, Feb. 29-Mar. 3, 1988, pp. 116-118, especially abstract and Supertek S-1 functional block diagram.

Gandhi, Dipakkumar B., Office Action in U.S. Appl. No. 09/668,059, mailed Jul. 21, 2003, pp. 1-8.

* cited by examiner

Primary Examiner—Guy Lamarre
Assistant Examiner—Dipakkumar Gandhi
(74) Attorney, Agent, or Firm—Mitchell Silberberg & Knupp LLP

(57) ABSTRACT

Provided are methods and apparatuses for decoding input data by using a single decoder for decoding a first set of symbols and then, after those decoded symbols have been interleaved, using the same decoder for decoding the decoded and interleaved first set of symbols together with a second set of symbols. Also provided are methods and apparatuses for decoding input data by using multiple read/write means for controlling the storage and reading of data so as to interleave and/or de-interleave data simultaneously with data buffering.

17 Claims, 5 Drawing Sheets

TURBO DECODING

This is a divisional of application Ser. No. 09/668,059 filed Sep. 20, 2000, now abandoned.

BACKGROUND OF THE INVENTION

1. Field of the Invention

The present invention relates to methods and apparatuses for decoding turbo codes and similar codes used in communications systems. In connection with such decoding, the present invention also provides improved techniques for interleaving and de-interleaving. Such interleaving and de-interleaving techniques also may be used in various other applications in communications systems and other systems.

2. Description of the Related Art

In order to reduce the likelihood of information loss due to fading, noise and other communication channel imperfections, it has become common in the design of communications systems to code digital signals to be transmitted. Such coding typically involves spreading the information contained in the data bits across a greater number of data bits. The simplest form of such coding is repetition coding in which each bit is simply repeated N times, N being an integer. However, in practice it is more common to use convolutional encoding, in which the value of each output symbol is formed on the basis of multiple input bits.

In any event, once such information spreading has been completed, the resulting symbols are typically interleaved, so as to insure that correlated information bits are not immediately adjacent to each other in the time domain. By so interleaving, the effects of bursts of noise or fading are distributed over multiple input bits. The end result is that the probability that any particular input bit cannot be recovered at the receiving end is significantly reduced, meaning more accurate reproduction at the receiving side of the communication channel.

One type of encoding that recently has become prevalent is turbo coding, such as the turbo coding defined in the IS-2000 standard. A simplified block diagram of a system 20 for implementing IS-2000 turbo coding is illustrated in FIG. 1. As shown in FIG. 1, input into system 20 is a sequence of information bits 22 to be communicated. Information bits 22 are supplied directly to convolutional encoder 24 and are supplied to convolutional encoder 28 via turbo interleaver 26. Encoders 24 and 28 are identical. Turbo interleaver 26 is a block interleaver, meaning that it interleaves bits in fixed-length segments (or blocks), with the bits of each such block being interleaved independently of any other block, but with the interleaving pattern being identical for all blocks. The precise details of the operation of interleaver 26 and encoders 24 and 28 are not critical to the present invention and therefore are not discussed here. However, each encoder outputs three symbols for each input bit. Thus, encoder 24 outputs symbols X, Y0 and Y1 and encoder 28 outputs symbols X', Y0' and Y1'. Typically, X' is simply discarded and only the X, Y0, Y1, Y0' and Y1' symbols (the turbo code) are transmitted, with the possible puncture of some of these symbols to accommodate different (e.g., higher) coding rates.

Specifically, the turbo code generated in the foregoing manner is first provided to channel interleaver and symbol puncturer 30, which interleaves the coded output symbols and also punctures certain of the symbols to insert power control signals and/or to accommodate various coding rates. Thereafter, the resulting symbols can be processed for transmission, such as by performing quadrature phase-shift keying.

A system 50 for performing straightforward decoding of the symbols generated by system 20 is illustrated in FIG. 2. Initially, channel de-interleaver 52 zeroes the symbols punctured by channel interleaver and symbol puncturer 30 and then de-interleaves the interleaving performed by channel interleaver and symbol puncturer 30. For each input bit k, the received symbols X, Y0 and Y1, together with a feedback signal $L(u_k)$, are input into a posteriori probability (APP) decoder 54. On the first pass, $L(u_k)$ is zero for all values of k. Upon completion of its decoding operation, APP decoder 54 outputs a soft value $\tilde{L}(\hat{u}_k)$ for each value of k. $\tilde{L}(\hat{u}_k)$ is then interleaved with interleaver 56 to provide $L(u_n)$ which is then input into APP decoder 58, together with all Y0' and Y1' for the current block. The output of APP decoder 58, $\tilde{L}(\hat{u}_n)$, is then de-interleaved in de-interleaver 60. Finally, the output of de-interleaver 60, $L(u_k)$, is input into APP decoder 54, together with all X, Y0 and Y1 for the current block, for the next pass of processing to be performed by system 50. The foregoing process is repeated for multiple iterations. In this regard, it is noted that channel de-interleaver 52 makes available all X, Y0, Y1, Y0' and Y1' for each original input bit in the current block. After a number of iterations, as described above, the values $\tilde{L}(\hat{u}_k)$ and $L(u_k)$ are added together for each input bit k in adder 62. The output of adder 62, $L(\hat{u}_k)$, is then input into hard decision module 64 to provide a final decision for each bit. Typically, hard decision module 64 is implemented as a threshold detector.

SUMMARY OF THE INVENTION

While system 50, shown in FIG. 2 provides a straight forward implementation for decoding turbocode according to the IS-2000 standard, a more efficient implementation of a decoding system is needed. In particular, it is noted that system 50 requires two identical APP decoders 54 and 58, as well as one interleaver 56 and one de-interleaver 60. Each of interleaver 56 and de-interleaver 60 typically requires a buffer for storing an entire block of samples. For example, for an IS-2000 supplemental channel of 153.6 Kilobits per second encoded at ¼ rate, with eight bits representing each entry in the interleaver buffer 56 and the de-interleaver buffer 60, the total buffering requirement is two buffers×153.6 Kbits×20 ms×8 bits=6 Kilobytes. Thus, what is needed is a more simplified implementation of a turbo decoder.

The present invention addresses this need by utilizing a single decoder for both phases of a decoding operation.

Thus, in one aspect the invention is directed to decoding input data that includes a first set of symbols and a second set of symbols. The first set of symbols and a feedback set of symbols are decoded using a decoder, thereby obtaining a first set of decoded symbols. Then, the first set of decoded symbols are interleaved, thereby obtaining a first set of interleaved symbols. The first set of interleaved symbols and the second set of symbols are then decoded using the same decoder, thereby obtaining a second set of decoded symbols. Finally, the second set of decoded symbols are de-interleaved, thereby obtaining a second set of de-interleaved symbols. The preceding steps are then repeated for at least one additional iteration, and at each iteration the feedback set of symbols is the second set of de-interleaved symbols obtained during the immediately previous iteration.

By reusing the same decoder for both phases of a decoding operation in the foregoing manner, the present invention often can provide a decoding system that uses less hardware than is typically required by conventional systems.

The present invention also addresses the deficiencies of the prior art by using a register to rearrangement data positions in each row of a block of data arranged in a matrix arrangement.

Thus, in a further aspect, the invention is directed to interleaving or de-interleaving data. Initially, data are written into a buffer, in which data positions in the buffer are conceptually arranged in columns of data positions and rows of data positions. A row of the data is transferred from a selected row of data positions in the buffer and into a register. The row of data is then transferred from the register into the selected row of data positions in the buffer, such that prior to the first transfer the row of data was arranged in a first order in the selected row of data positions, and after the second transfer the row of data is arranged in a second order in the selected row of data positions, with the first order being different than the second order. Such transfer steps are then repeated for each row of data positions in the buffer. At some point, the data are read from the buffer and the data positions are row interleaved.

In a still further aspect, the invention is directed to interleaving or de-interleaving data. Initially, a block of data is input, the data conceptually arranged in columns of data positions and rows of data positions. The block of data is written into a buffer and the rows of data positions are interleaved. A row of the data is then transferred from a selected row of data positions in the buffer into a register, and the row of data thereafter is transferred from the register into the selected row of data positions in the buffer, such that prior to the first transfer the row of data was arranged in a first order in the selected row of data positions, and after the second transfer the row of data is arranged in a second order in the selected row of data positions, with the first order being different than the second order. The preceding transfer steps are then repeated for each row of data positions in the buffer.

By virtue of the foregoing arrangements, it is often possible to perform interleaving and de-interleaving using the same buffer. In this scenario, the transfers to and from the register are used to perform column interleaving.

The present invention also addresses the deficiencies of the prior art by providing a complete system for decoding an input signal using a single buffer and a single decoder.

Thus, in a still further aspect, the invention is directed to an apparatus for decoding input data. Input means inputs coded data, and a buffering means inputs, stores and outputs data. First register means stores a portion of the data output from the buffering means, and first read/write means controls writing of the data into the first register means and reading of the data out of the first register means so as to change the order of the data. Decoding means decodes a combination of at least part of the coded data provided by the input means and the data read out of the first register means. Second register means stores data output by the decoding means, and second read/write means controls writing of the data into the second register means and reading of the data out of the second register means so as to change the order of the data, with the data read out of the second register means being stored in the buffering means. Third read/write means for transfers the data out of a portion of the buffering means into a third register means, coupled to the buffering means, and then transfers the same data from the third register means back into the same portion of said buffering means, but in a different order, and repeats the transferring steps for different portions of the buffering means.

The foregoing summary is intended merely to provide a brief description of the general nature of the invention. A more complete understanding of the invention can be obtained by referring to the claims and the following detailed description of the preferred embodiments in connection with the accompanying figures.

DETAILED DESCRIPTION OF THE PREFERRED EMBODIMENTS

Figure 1:
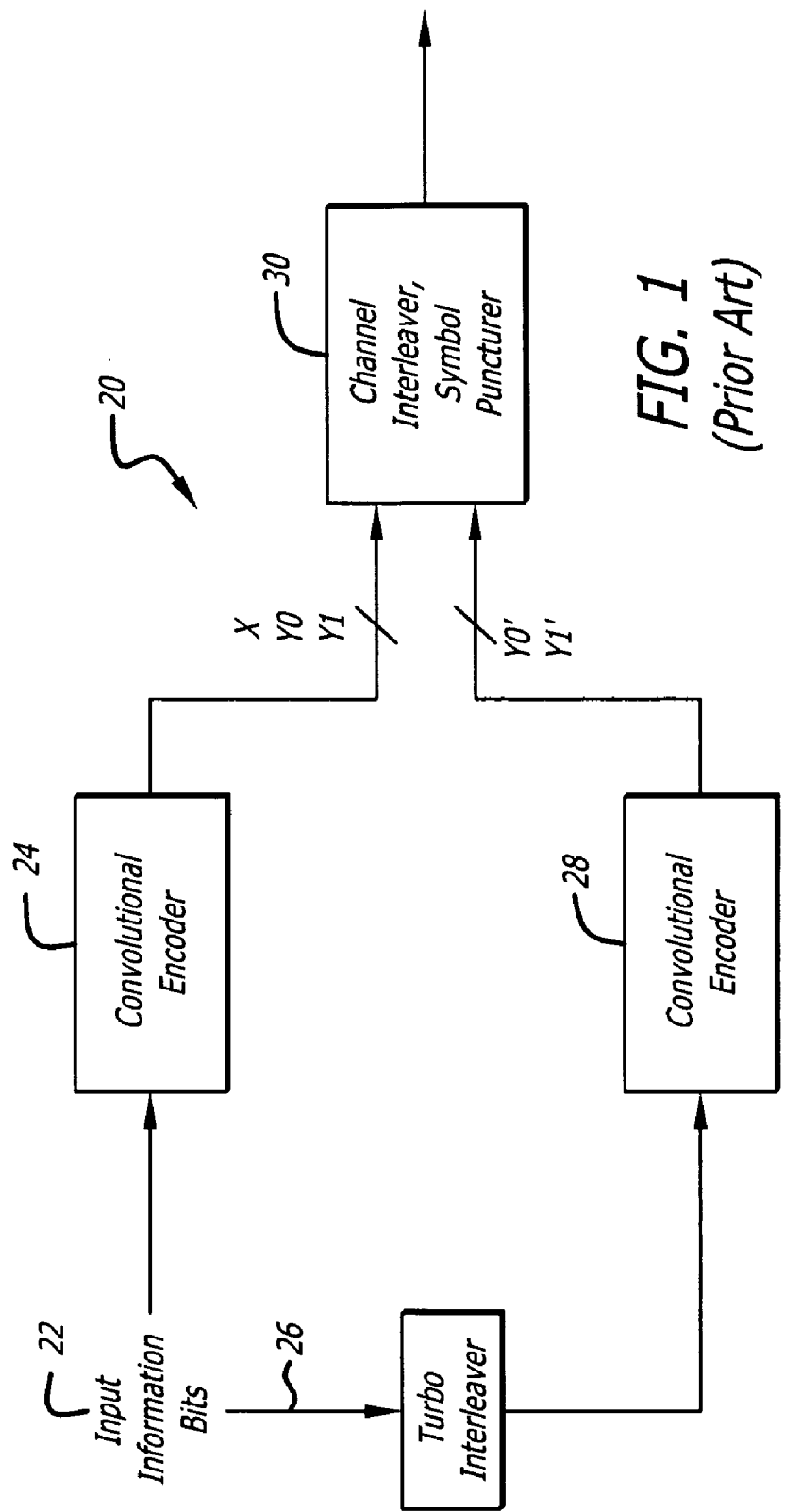
FIG. 1 is block diagram showing a conventional turbo encoder.
Figure 2:
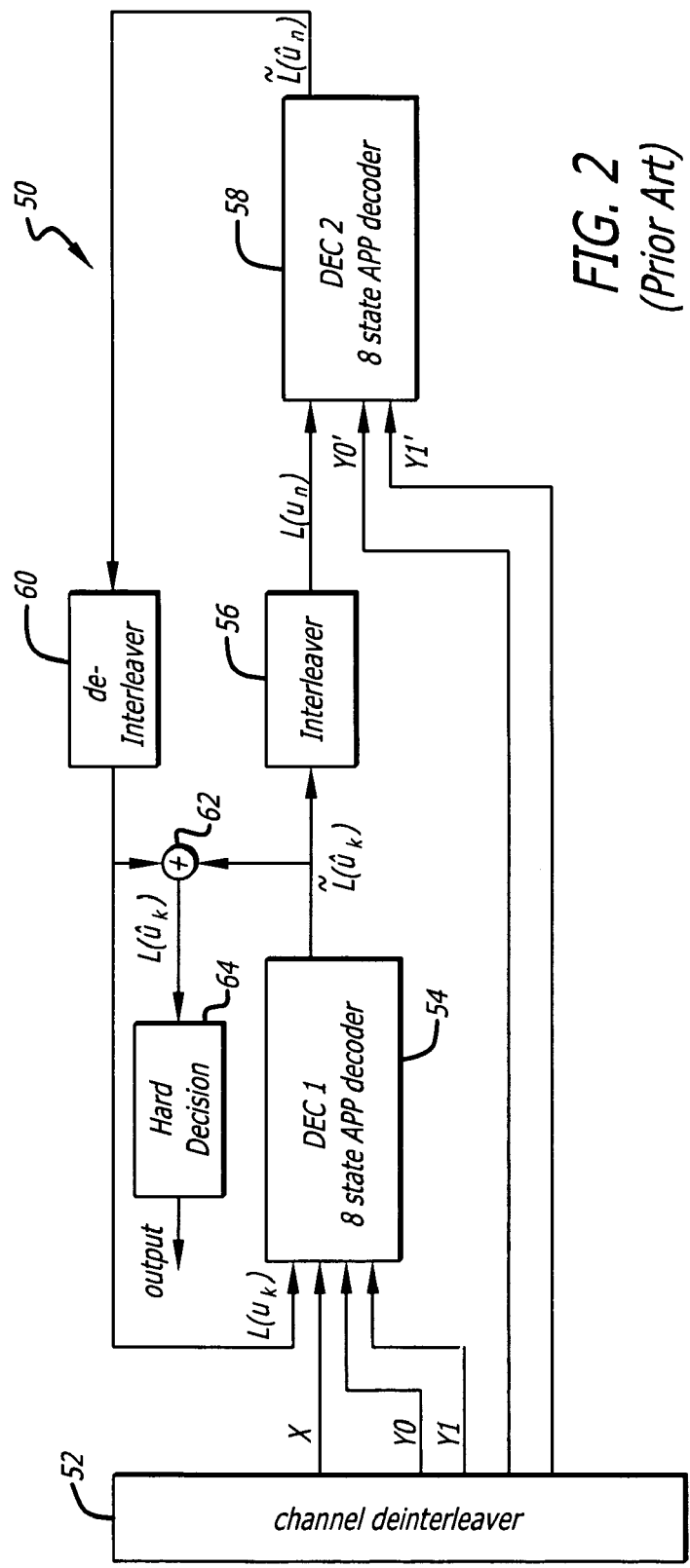
FIG. 2 is a block diagram showing a conventional turbo decoder.
Figure 3:
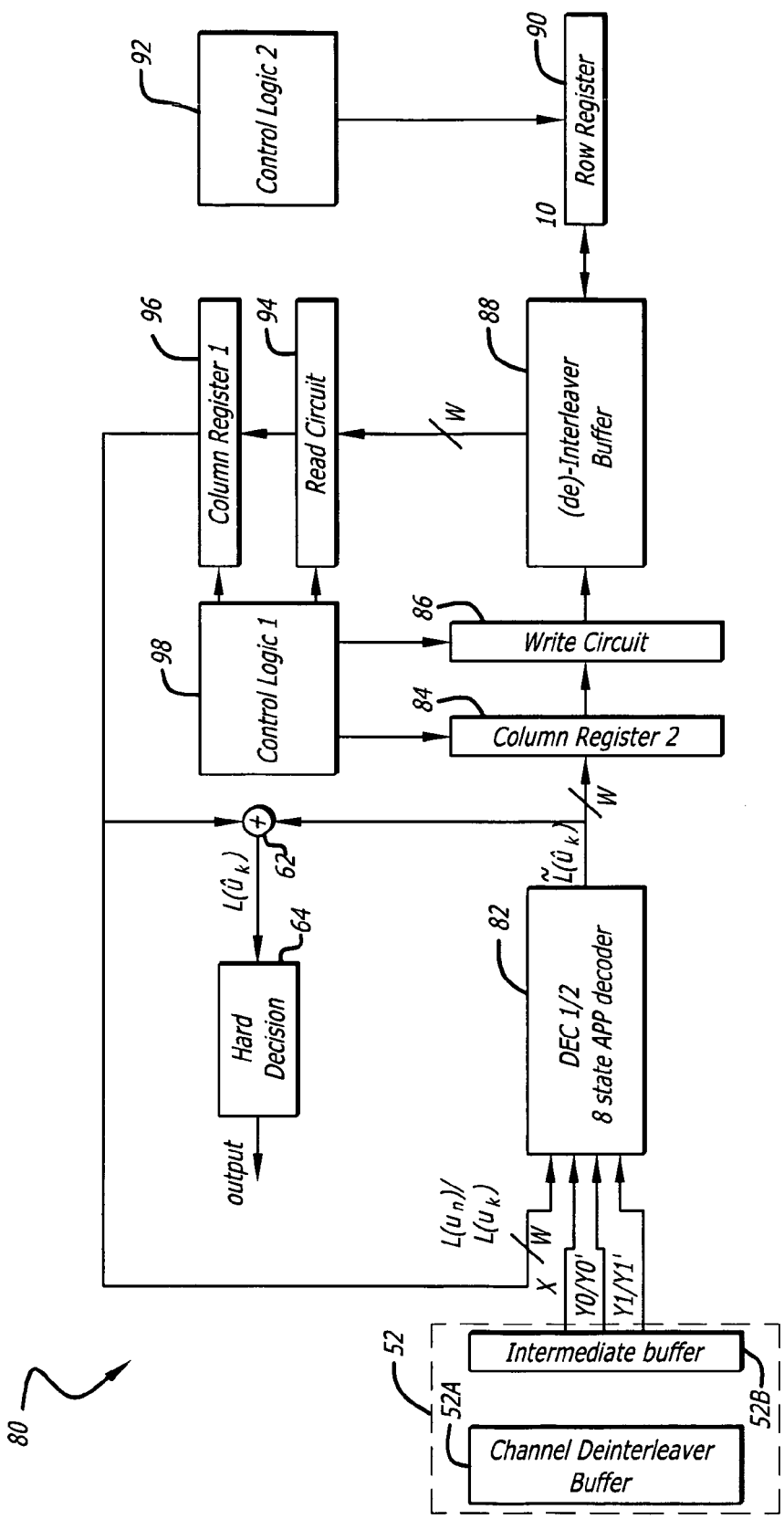
FIG. 3 is a block diagram illustrating a representative embodiment of a turbo decoder according to the present invention.

FIG. 3 illustrates a system 80 for decoding turbo code according to a representative embodiment of the present invention. Included in system 80 is a channel de-interleaver 52, which includes a channel de-interleaver buffer 52A and an intermediate buffer 52B. Data read from intermediate buffer 52B are input into APP decoder 82, together with a feedback signal $L(u_k)$. Connected to the output of APP decoder 82 is column register 84 which stores a column of symbols. Under the control of control logic 98, write circuit 86 reads the column of symbols from column register 84 and writes them into buffer 88. Buffer 88 stores a block of symbols in connection with performing both interleaving and de-interleaving processes according to the present invention. Row register 90 also is connected to buffer 88 and is used for temporarily storing a row of symbols, as described in more detail below. Control logic 92 is connected to row register 90 and effects the transfer of a row of symbols from buffer 88 to row register 90 and then the transfer of those symbols from row register 90 back to buffer 88, also as described in detail below. Read circuit 94 also is connected to buffer 88 and reads data from buffer 88 under the control of control logic 98. The data read by read circuit 94 are written into column register 96, also under the control of control logic 98. The output of column register 96 is then fed back into APP decoder 82 as either $L(u_n)$ or $L(u_k)$, depending upon the phase in which system 80 is operating. Also provided in system 80 are adder 62 which may be identical to the corresponding adder 62 shown in FIG. 2 and hard decision module 64 which may be identical to the hard decision module 64 shown in FIG. 2.

As will be readily appreciated, system 80 includes only a single APP decoder 82 and a single buffer 88. This contrasts with system 50 which requires two APP decoders 54 and 58, as well as two buffers, one in each of interleaver 56 and de-interleaver 60. As a result, system 80 typically can be implemented with significantly less hardware than conventional systems require. Each of the modules shown in FIG. 3 may be implanted in dedicated hardware, in programmable hardware, in software, or an any combination of these. In addition, it should be understood that the functionality described for the blocks in FIG. 3 may be divided up in other ways as well.

Figure 4A:
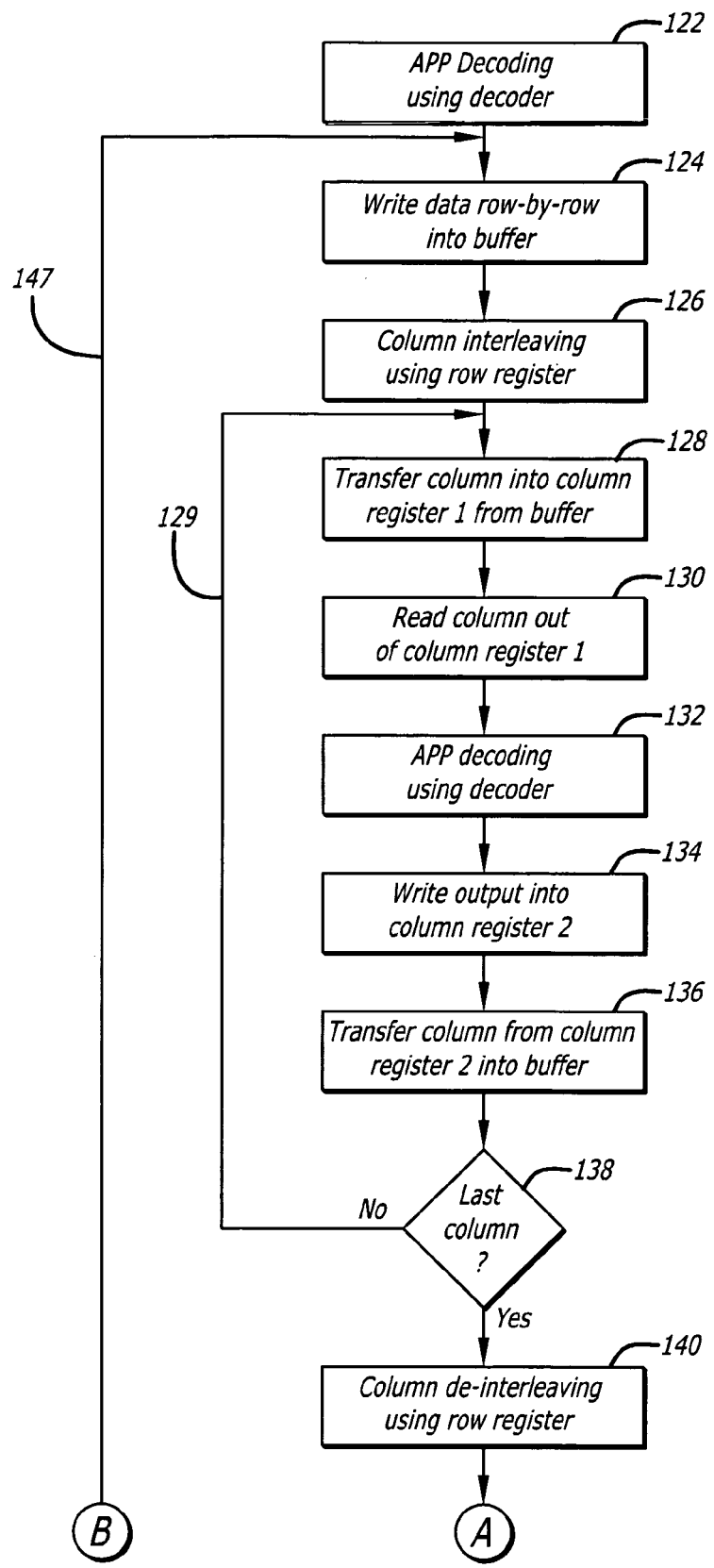
FIGS. 4A and 4B illustrate a flow diagram of the processing performed by the system illustrated in FIG. 3.
Figure 4B:
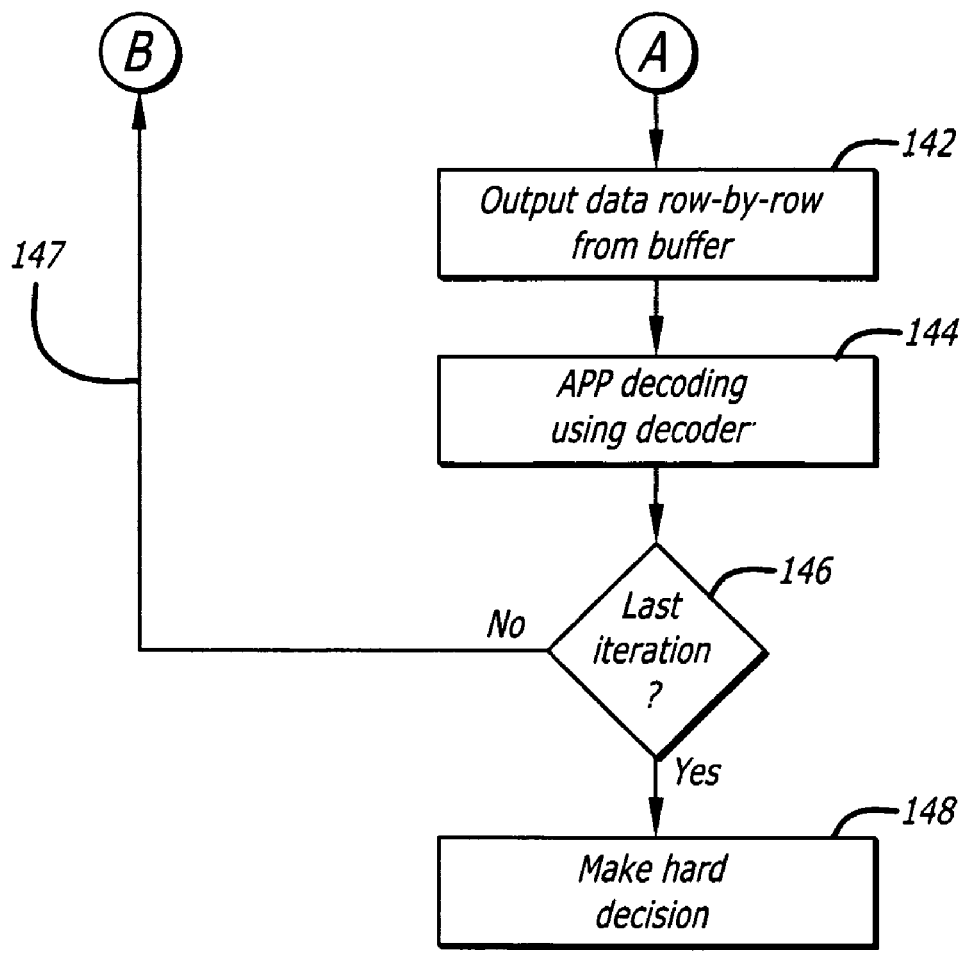

The operation of system 80 will now be described with reference to the flow diagram shown in FIG. 4. As noted above, data are input into system 80 via channel de-interleaver 52.

In step 122, APP decoding is performed by APP decoder 82. Specifically, at this stage all X, Y0 and Y1, together with $L(u_k)$ are input into decoder 82. Ordinarily, decoder 82 initially sums the feedback signal $L(u_k)$ with X. However, in this initial phase, $L(u_k)$ is set to zero for all values of k. This can be accomplished by pre-loading buffer 88 with all zeros or by simply forcing the $L(u_k)$ signal to zero during this phase.

In step 124, the signal $\tilde{L}(\hat{u}_k)$ is output from decoder 82 and written row-by-row into buffer 88. Thus, in this step column register 84 and write circuit 86 can be simply bypassed and the signal that is output from decoder 82 can be written directly into buffer 88 in a row-by-row manner.

In this regard, signal $\tilde{L}(\hat{u}_k)$ preferably provides a multi-bit soft value for each originally input bit. In the preferred embodiment of the invention, $\tilde{L}(\hat{u}_k)$ is an eight-bit signal.

The block of input data is conceptually viewed as a matrix having rows and columns. For example, in the IS-2000 turbo code, the matrix has row_number rows and $2^n$ columns, where n is obtained from the number of bits in each frame for encoding N_turbo bits (i.e., the number of bits in a single block) as shown in the following table:

| Turbo interleaver block size N_turbo | Turbo Interleaver Parameter n |
|---|---|
| 378 | 4 |
| 570 | 5 |
| 762 | 5 |
| 1,146 | 6 |
| 1,530 | 6 |
| 2,298 | 7 |
| 3,066 | 7 |
| 4,602 | 8 |
| 6,138 | 8 | and parameter row_number=ceil(N_turbo/$2^n$), where ceil (x) is the smallest integer that is not less than x.

Thus, once N_turbo is known, the numbers of rows and columns are uniquely determined. It is noted that other encoding techniques will use different size matrices. Also, whenever reference is made herein to rows and/or columns, such references are intended to refer to the rows and columns of such a conceptualized matrix for a data block.

In step 126, column interleaving is performed using row register 90. It is noted that at this point, $\tilde{L}(\hat{u}_n)$ values are stored in buffer 88 for each of the input bits, and those values are conceptually stored in the format of a matrix, as described above.

The process of column interleaving in step 126 essentially involves the substeps of: (i) transferring a row of data values from buffer 88 to row register 90; (ii) rearranging the order of the data values within the row; (iii) transferring the rearranged data values back into the same row within buffer 88; and then (iv) repeating the foregoing steps for each row in buffer 88. The data position rearrangement may be identical for each row of buffer 88, meaning that the net effect of such manipulations is to rearrange whole columns in buffer 88 according to a predetermined pattern. However, in IS2000 each row is permutated differently, depending on the row index. In either event, the rearrangement generally will be predetermined. Because the rearrangement pattern will be dictated by the specific encoding technique used, no specific pattern is discussed in detail here.

It is noted that the foregoing data transfers from buffer 88 to row register 90 and back to buffer 88 are performed under the control of control logic module 92. Such column interleaving may be performed by: (i) rearranging the data positions upon transferring the data from buffer 88 to row register 90; (ii) rearranging the data positions upon transferring the data from row register 90 back to buffer 88; or (iii) rearranging the data positions during both such operations.

In step 128, a column of data is transferred from buffer 88 into column register 96 by read circuit 94 under the control of control logic module 98. Preferably, on the first pass of loop 129 the first column is read out of buffer 88, and on subsequent iterations each consecutive column thereafter is read out of buffer 88.

In step 130, the data in column register 96 is read out and input into decoder 82 as $L(u_n)$. Preferably, the net effect of the combination of steps 128 and 130 is to rearrange the data positions in each column of buffer 88. More preferably, the pattern of such rearrangement is the same for each column in buffer 88, meaning that the net effect of these operations is to perform row interleaving on the contents of buffer 88. This may be accomplished either by: (i) rearranging the data when transferring them from buffer 88 to register 96; (ii) rearranging the data when reading them out of register 96; or (iii) rearranging the data positions during both of such operations.

It is noted that the combination of steps 126, 128 and 130 perform the interleaving function that is conventionally performed by interleaver 56.

In step 132, decoding is performed using APP decoder 82. It is noted that at this point, decoder 82 is performing the function of decoder 58 shown in FIG. 2. Thus, decoder 82 inputs all Y0' and Y1' from channel de-interleaver 52, as well as $L(u_n)$ which has been provided by column register 96. Functionally, decoder 83 operates in the same manner as it did in the previous phase, except that: instead of inputting the quantity $L(u_k)$+X, decoder 82 inputs $L(u_n)$ only; instead of inputting Y0, decoder 82 inputs Y0', and instead of inputting Y1, decoder 82 inputs Y1'.

In step 134, a column of data output from decoder 82 is written into column register 84.

In step 136, the column of data in column register 84 is transferred to a corresponding column in buffer 88 by write circuit 86 under the control of control logic module 98. The net effect of steps 134 and 136 preferably is to rearrange the data positions in each column of data that is written in to buffer 88. More preferably, those rearrangements are structured so as to perform row de-interleaving as dictated by the encoding technique used. Once again, such data position rearrangement may be performed upon: writing the data into register 84, transferring the data from register 84 to buffer 88, or both.

The writing of a column of data into buffer 88 from register 84 may be performed concurrently with or independently of the transfer of a column of data from buffer 88 into register 86. Typically, however, due to delays introduced by the processing of decoder 82, the row interleaving that occurs in connection with register 96, and the row de-interleaving that occurs in connection with register 84, the writing of data into buffer 88 typically will lag behind the reading of columns of data out of buffer 88 by one or two columns.

It is also noted that the illustrated sequence of steps 128, 130, 132, 134 and 136 are for ease of understanding only. In practice, such steps may be performed in various orders, and often will overlap to some extent. In any event, it is preferable that columns of data are read out of buffer 88, row interleaved, processed by decoder 82, row de-interleaved and then written into the same columns in buffer 88. Due to the delay inherent in the system, it generally will be unlikely that read/write conflicts will occur with respect to buffer 88. However, if such conflicts are found to exist, additional delay can be introduced into the system to avoid such conflicts.

In step 138, a determination is made as to whether the current column is the last of the matrix in buffer 88. If not, then processing returns to step 128. If so, the processing proceeds to step 140, after waiting for an appropriate period of time, if necessary, for the remaining columns to be written into buffer 88 by write circuit 86.

In step 140, column de-interleaving is performed by using row register 90. It is noted that at this point buffer 88 is loaded with an entire block of data. The de-interleaving process of this step is similar to the interleaving process performed in step 126, although different data position rearrangement may be performed in order to accomplish de-interleaving instead of interleaving.

In step 142, data are output from buffer 88 in a row-by-row fashion. Preferably, such data are directly provided to decoder 82, by by-passing read circuit 94 and column register 96. Generally, this step will be performed at approximately the same time as step 124 in the next iteration of loop 147, but with this step 142 one or two rows ahead of step 124.

In step 144, APP decoding is performed using APP decoder 82. This step is identical to step 122 described above, except that in this case actual values are provided for $L(u_k)$, and those values are summed with the corresponding X values.

In step 146, a determination is made as to whether the last iteration of processing has been performed. In this regard, system 80 may be configured so that a fixed number of iterations is performed or so that iterations are performed until a specified criterion has been satisfied. If additional iterations are required, then processing returns to step 124. Otherwise, processing proceeds to step 148.

In step 148, a hard decision is made by summing the current values of $L(u_k)$ and $\tilde{L}(\hat{u}_k)$ in adder 62 for each k and then providing the summations to hard decision module 64. Preferably, hard decision module 64 specifies a bit value for each k by performing a thresholding operation on the output of adder 62. More preferably, such thresholding operation determines whether the output of adder 62 is greater than zero or less than zero.

The present invention has been described above with reference to an embodiment that decodes turbo code defined by the IS-2000 standard. However; it should be understood that the present invention is not limited only to IS-2000 turbo code. Rather, similar architecture and processes may be applied to any other turbo code that utilizes a matrix interleaving algorithm in which the interleaving is performed by column interleaving followed by row interleaving, or row interleaving followed by column interleaving. In this regard, it is noted that the terms "column" and "row" are used in their relative senses above and merely represent mutually orthogonal data arrangements in a matrix conceptualization. Therefore, such terms may be interchanged, provided that the interchange is consistently applied, without loss of generality. In addition, the architecture and processes described above may be utilized in connection with decoding other types of codes, as will be readily appreciated by those skilled in the art.

In further embodiments of the present invention, it is possible to eliminate either or both of column register 84 and column register 96. This may be accomplished, for example, by appropriately timing the reading from and writing into buffer 88, in combination with the use of writing circuitry 86 and reading circuitry 94 that writes data into and reads data from buffer 88 into and out of appropriate column positions in buffer 88 so as to perform row de-interleaving and interleaving on-the-fly.

System Environment.

In addition to using dedicated or programmable hardware, as indicated above, the methods and techniques described herein can be practiced with a general-purpose computer system. Such a computer typically will include, for example, at least some of the following components: one or more central processing units (CPUs), read-only memory (ROM), random access memory (RAM), input/output circuitry for interfacing with other devices and for connecting to one or more networks, a display (such as a cathode ray tube or liquid crystal display), other output devices (such as a speaker or printer), one or more input devices (such as a mouse or other pointing device, keyboard, microphone or scanner), a mass storage unit (such as a hard disk drive), a real-time clock, a removable storage read/write device (such as for reading from and/or writing to a magnetic disk, a magnetic tape, an opto-magnetic disk, an optical disk, or the like), and a modem. In operation, the process steps to implement the above methods typically are initially stored in mass storage (e.g., the hard disk), are downloaded into RAM and then executed by the CPU out of RAM.

Suitable computers for use in implementing the present invention may be obtained from various vendors. Various types of computers, however, may be used depending upon the size and complexity of the tasks. Suitable computers include mainframe computers, multiprocessor computers, workstations, personal computers, and even smaller computers such as PDAs, wireless telephones or any other networked appliance or device. In addition, although a general-purpose computer system has been described above, a special-purpose computer may also be used. In particular, any of the functionality described above can be implemented in software, hardware, firmware or any combination of these with the particular implementation being selected based on known engineering tradeoffs.

It should be understood that the present invention also relates to machine-readable media on which are stored program instructions for performing the methods of this invention. Such media include, by way of example, magnetic disks, magnetic tape, optically readable media such as CD ROMs and DVD ROMs, semiconductor memory such as PCMCIA cards, etc. In each case, the medium may take the form of a portable item such as a small disk, diskette, cassette, etc., or it may take the form of a relatively larger or immobile item such as a hard disk drive, ROM or RAM provided in a computer.

Conclusion

Although the present invention has been described in detail with regard to the exemplary embodiments and drawings thereof, it should be apparent to those skilled in the art that various adaptations and modifications of the present invention may be accomplished without departing from the spirit and the scope of the invention. Accordingly, the invention is not limited to the precise embodiments shown in the drawings and described in detail above. Rather, it is intended that all such variations not departing from the spirit of the invention be considered as within the scope thereof as limited solely by the claims appended hereto.

Also, several different embodiments of the present invention are described above, with each such embodiment described as including certain features. However, it is intended that the features described in connection with the discussion of any single embodiment are not limited to that embodiment but may be included and/or arranged in various combinations in any of the other embodiments as well, as will be understood those skilled in the art.

What is claimed is:

1. A method for decoding input data, said method comprising:
    (a) inputting a first set of symbols and a second set of symbols;
    (b) decoding the first set of symbols and a feedback set of symbols using a decoder, thereby obtaining a first set of decoded symbols;
    (c) interleaving the first set of decoded symbols, thereby obtaining a first set of interleaved symbols;
    (d) decoding the first set of interleaved symbols and the second set of symbols using the decoder, thereby obtaining a second set of decoded symbols;
    (e) de-interleaving the second set of decoded symbols, thereby obtaining a second set of de-interleaved symbols; and
    (f) repeating steps (b) through (e) for at least one additional iteration, wherein at each iteration the feedback set of symbols is the second set of de-interleaved symbols obtained during the immediately previous iteration.

2. A method according to claim 1, wherein identical hardware is used for decoding in step (b) as for decoding in step (d).

3. A method according to claim 1, wherein the decoder is an a posteriori probability decoder.

4. A method according to claim 1, wherein interleaving in step (c) comprises:
    (c1) writing the first set of decoded symbols into a buffer, row-by-row;
    (c2) reading from the buffer and writing into a row register a row of the first set of decoded symbols;
    (c3) reading from the row register and writing into the buffer the row of the first set of decoded symbols, so as to perform column interleaving;
    (c4) reading from the buffer and writing into a column register a column of the first set of decoded symbols; and
    (c5) reading from the column register the column of the first set of decoded symbols,
    wherein steps (c4) and (c5) together result in row interleaving.

5. A method according to claim 4, wherein de-interleaving in step (e) comprises:
    (e1) writing into a second column register the column of the second set of decoded symbols;
    (e2) reading from the second column register and writing into the buffer the column of the second set of decoded symbols, wherein steps (e1) and (e2) together result in row interleaving;
    (e3) reading from the buffer and writing into the row register the row of the second set of decoded symbols; and
    (e4) reading from the row register and writing into the buffer the row of the second set of decoded symbols, so as to perform column interleaving.

6. A method according to claim 5, wherein step (c4) is performed prior to step (e2) for each column in the buffer.

7. A method according to claim 1, wherein a single buffer is used for both interleaving in step (c) and de-interleaving in step (e).

8. A method according to claim 1, wherein steps (b) through (e) are repeated for a predetermined number of iterations.

9. A method according to claim 8, further comprising a step of making a hard decision for each bit position of said input data after completion of said predetermined number of iterations.

10. An apparatus for decoding input data, said apparatus comprising:
    input means for inputting coded data;
    buffering means for inputting, storing and outputting data;
    first register means for storing a portion of the data output from said buffering means;
    first read/write means for controlling writing of the data into said first register means and reading of the data out of said first register means so as to change the order of the data;
    decoding means for decoding a combination of at least part of the coded data provided by said input means and the data read out of said first register means;
    second register means for storing data output by said decoding means;
    second read/write means for controlling writing of the data into said second register means and reading of the data out of said second register means so as to change the order of the data, wherein the data read out of said second register means is stored in said buffering means;
    third register means coupled to said buffering means; and
    third read/write means for transferring the data out of a portion of said buffering means into said third register means and then transferring the same data from said third register means back into said portion of said buffering means, but in a different order, and for then repeating said transferring steps for different portions of said buffering means.

11. An apparatus according to claim 10, wherein data positions in said buffering means are conceptually arranged in columns of data positions and rows of data positions, wherein said first register means and said second register means are for storing a column of data, and wherein said third register means is for storing a row of data.

12. An apparatus according to claim 11, wherein said first read/write means reads data from a column in said buffering means prior to when said second read/write means writes data to the same column in said buffering means.

13. An apparatus according to claim 10, wherein said third read/write means is activated each time all the data in said buffering means has been rewritten.

14. An apparatus according to claim 10, wherein said decoding means comprises an a posteriori probability decoder.

15. An apparatus according to claim 10, further comprising means for making a hard decision for each bit position of input data.

16. An apparatus according to claim 10, wherein said first register means, said second register means, and said third register means are capable of storing only a fraction of the data that said buffering means is capable of storing.

17. An apparatus for decoding input data, said apparatus comprising:

(a) means for inputting a first set of symbols and a second set of symbols;
(b) means for decoding the first set of symbols and a feedback set of symbols using a decoder, thereby obtaining a first set of decoded symbols;
(c) means for interleaving the first set of decoded symbols, thereby obtaining a first set of interleaved symbols;
(d) means for decoding the first set of interleaved symbols and the second set of symbols using the decoder, thereby obtaining a second set of decoded symbols;
(e) means for de-interleaving the second set of decoded symbols, thereby obtaining a second set of de-interleaved symbols; and
(f) means for repeating the functionality of means (b) through (e) for at least one additional iteration, wherein at each iteration the feedback set of symbols is the second set of de-interleaved symbols obtained during the immediately previous iteration.

* * * * *